United States Patent [19]

Hargis

[11] 4,426,773
[45] Jan. 24, 1984

[54] ARRAY OF ELECTRONIC PACKAGING SUBSTRATES

[75] Inventor: Billy M. Hargis, Hugo, Minn.

[73] Assignee: General Electric Ceramics, Inc., Cleveland, Ohio

[21] Appl. No.: 263,915

[22] Filed: May 15, 1981

[51] Int. Cl.³ .......................... H05K 3/30; H05K 1/11
[52] U.S. Cl. ....................................... 29/832; 361/412; 29/418; 29/577 C; 324/51
[58] Field of Search ................. 29/832, 844, 407, 418, 29/845, 577; 361/414, 412; 324/51; 339/17 E, 339/17 F

[56] References Cited

U.S. PATENT DOCUMENTS

| | | | |
|---|---|---|---|
| 3,553,830 | 1/1971 | Jenny et al. | 29/577 X |
| 3,746,973 | 7/1973 | McMahon, Jr. | 324/51 |
| 3,830,956 | 8/1974 | Wooton et al. | 339/17 E X |
| 3,839,781 | 10/1974 | Russell | 29/577 X |
| 3,864,810 | 2/1975 | Hargis | 29/418 X |
| 3,926,746 | 12/1975 | Hargis | 361/414 X |
| 4,220,917 | 9/1980 | McMahon, Jr. | 324/51 X |

Primary Examiner—Howard N. Goldberg
Assistant Examiner—Carl J. Arbes
Attorney, Agent, or Firm—John F. McDevitt; Philip L. Schlamp; Fred Jacob

[57] ABSTRACT

An array of electronic packaging substrates in horizontal and vertical rows in which each substrate has a plurality of internal and external terminals that are electrically interconnected is described. The array has (a) lines of separation along which the substrates may be separated from the array, (b) a plurality of adjacent rows of substrates with lines of separation therebetween that are spaced and parallel, and (c) at least a pair of metallized traces at least one of which runs between the spaced lines of separation, each of which is electrically connected to at least one external terminal in the adjacent rows of substrates and to a contact pad on the array. Selected terminals of substrates in the array are thus electrically connected to a contact pad whereby, after attachment of electronic components to the substrates, the components may be tested in an array format.

9 Claims, 5 Drawing Figures

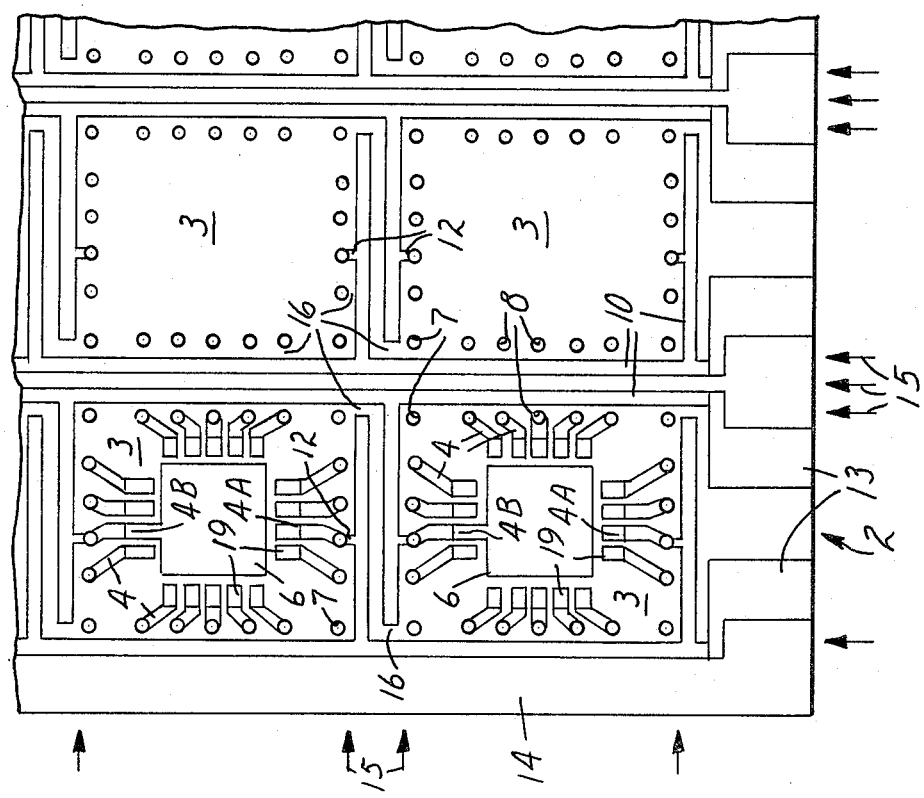

ARRAY OF ELECTRONIC PACKAGING SUBSTRATES

FIELD OF THE INVENTION

This invention relates to an array of electronic packaging substrates that may be utilized to test a number of electronic components connected to the terminals of the substrates. More particularly this invention relates to an array that has at least a pair of metallized traces, each of which are electrically connected to at least one separate terminal on each substrate in the array.

BACKGROUND ART

Electronic components, such as integrated circuits, are commonly subjected to stress testing before being used in order to detect those components that will fail early in their lifetime. One technique of stress testing is known as "burn-in" testing and involves assembling individual components on individual electronic packaging substrates, loading each substrate into its own test socket, mounting the test socket onto a so called "burn-in" test board, and subjecting the resulting test assembly to a predetermined electrical potential difference at an elevated temperature (e.g., 125° C. or above) for an extended period of time (e.g., up to 168 hours or more). While this technique successfully detects those components that are prone to early failure, it is not entirely satisfactory.

Thus, each of the above operations must be done separately for as many electronic components as are to be tested. Additionally, the resulting test assemblies are bulky and minimize the number of components that can be placed in a test oven at a given time. Furthermore, once burn-in testing has been completed, each of the test assemblies must be disassembled. As a result, this test technique is time consuming, expensive, and inconvenient.

The elevated temperatures utilized in the test also cause certain problems. Typically the test sockets and burn-in boards are designed to the reused. Thus, for example, they are made from materials that are resistant to the temperatures utilized in the test and are designed to permit ready assembly and disassembly of the test structure. Consequently, they employ mechanical fastening devices such as pins, clips, and springs to hold the structure together. Such sockets and boards are, therefore, expensive. Moreover, the nature of the burn-in test requires that a large inventory of such parts be maintained. Even though these parts are especially designed, they still wear out due to repeated use and the rigorous conditions under which they are used.

SUMMARY OF THE INVENTION

The present invention overcomes the foregoing disadvantages. It provides an array of electronic packaging substrates that are useful for testing a multiplicity of electronic components. The substrates in the array each have a plurality of electrically interconnected internal and external terminals to which the electronic components can be attached. The array has a multiplicity of electronic packaging substrates in horizontal and vertical rows, lines of separation along which each substrate is separable from the array, a plurality of adjacent rows of substrates having lines of separation therebetween that are spaced and parallel, at least a pair of primary metallized traces for providing electrical interconnection to the substrates, wherein at least one of said pair of primary metallized traces is between at least some of the spaced parallel lines of separation between adjacent rows of substrates, an electrical contact point that is electrically connected to each of the primary metallized traces, and a plurality of secondary metallized traces electrically connecting at least one of the external terminals of each of the substrates in adjacent rows to the primary metallized traces.

There is also provided a method for testing a multiplicity of electronic components in an array format. The method comprises the steps of constructing the above-described array, mounting electronic components on a predetermined number of substrates in the array, electrically connecting the electronic components to the internal terminals of the substrates, and selectively applying predetermined electrical potentials to internal terminals of the substrates at a predetermined temperature for a predetermined time.

The present invention permits an array of assembled electronic components to be utilized in stress (e.g., burn-in) testing procedures. As this eliminates the need to separate individual packaging substrates from the array prior to testing, several advantages are achieved. For example, the need to assemble each electronic component into an individual test structure and subsequently disassemble said structure is eliminated. As a result, testing is made less time consuming, less costly, and more convenient. Additionally, the arrays of the invention require less volume than do the above-described test structures thereby maximizing the number of electronic components that can be tested in an oven at a given time. Still further, the present invention eliminates the need to use individual test sockets, and substantially reduces the number of burn-in test boards that are needed.

Furthermore, the present invention permits the electronic components to be functionally tested by, for example, parametric testing techniques, in an array format. As a result, functional testing of the components is also made less time consuming, less costly, and more convenient.

BRIEF DESCRIPTION OF THE DRAWINGS

The present invention will be further understood by reference to the accompanying drawings wherein like reference numbers refer to the same elements throughout the several views, and wherein like reference numbers followed by different letters refer to similar elements throughout the several views, and wherein:

FIG. 3 represents a top plan view of the array of FIG. 1 showing a selected number of internal terminals of the substrates electrically disconnected from the primary metallized traces;

DETAILED DESCRIPTION

Figure 2:
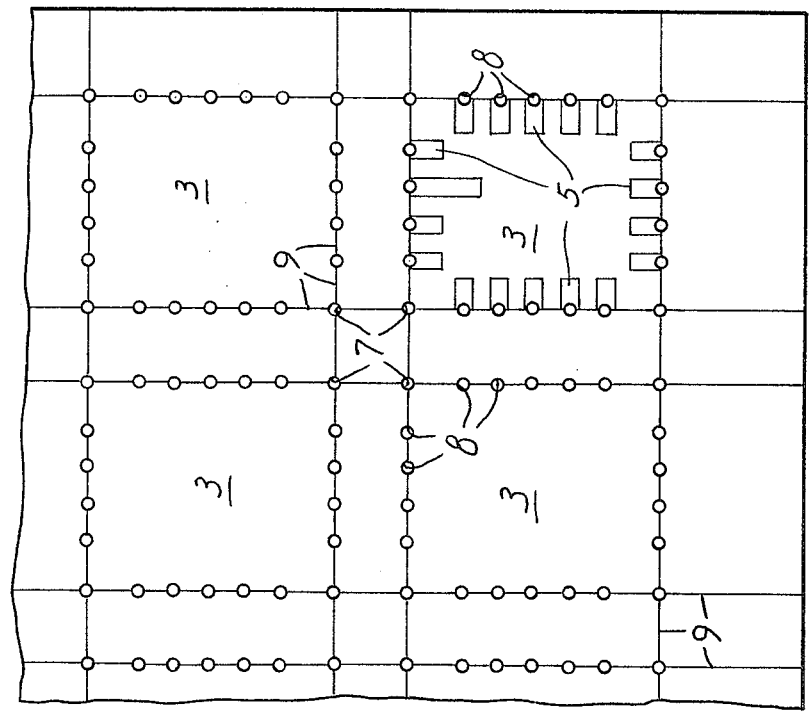
FIG. 2 represents a bottom plan view of the array of FIG. 1 showing the external terminals of each of the substrates electrically interconnected to the internal terminals by way of metallized vias.
Figure 1:
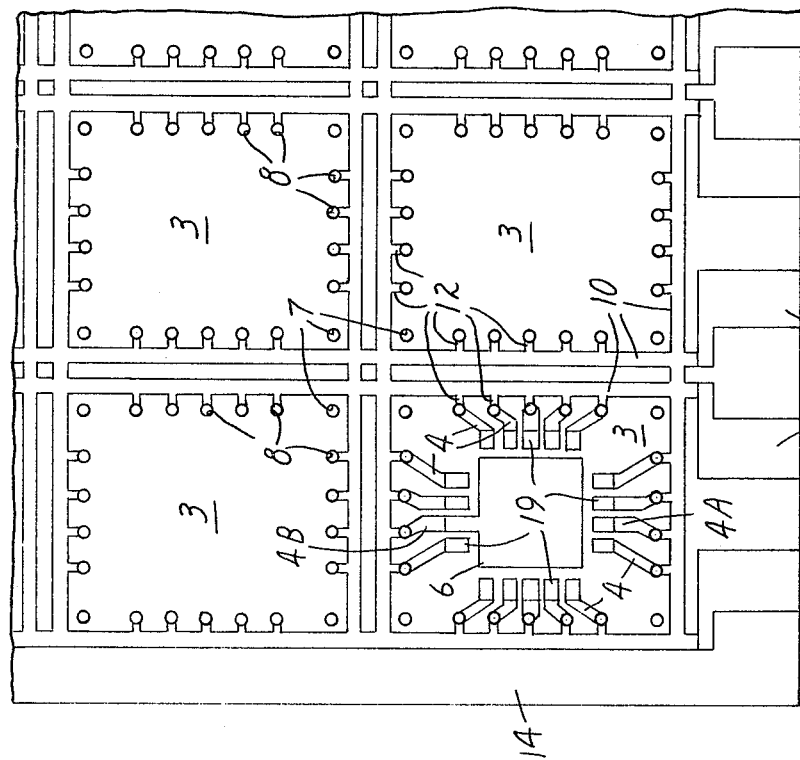
FIG. 1 represents a top plan view of one embodiment of the array of the invention showing the internal terminals of each of the substrates electrically interconnected to at least a pair of primary metallized traces by way of secondary metallized traces.
Figure 5:
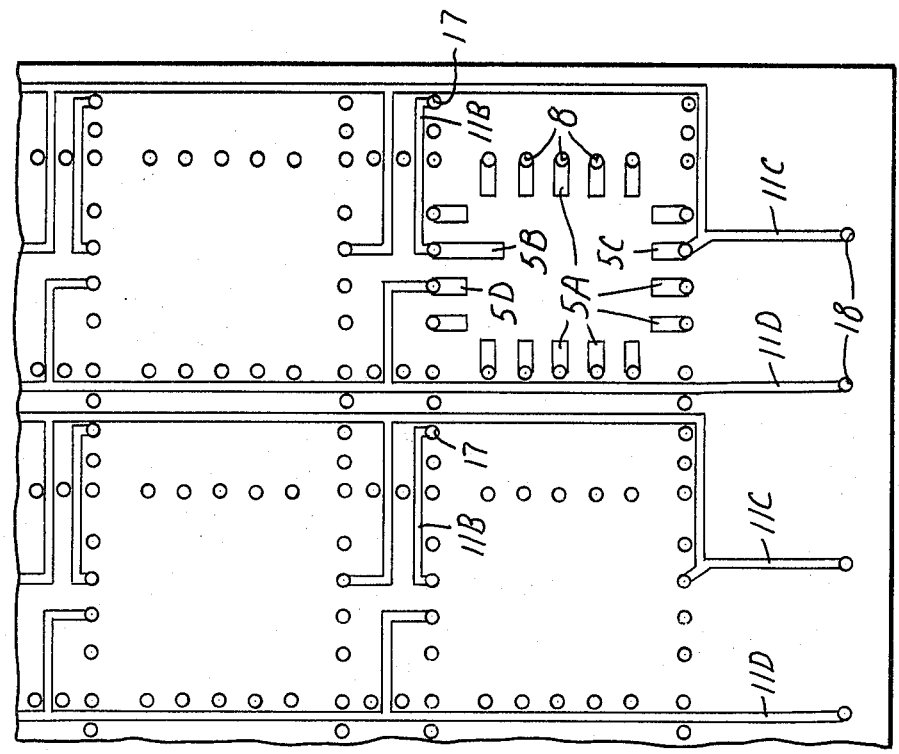
FIG. 5 represents a bottom plan view of the array of FIG. 4.
Figure 4:
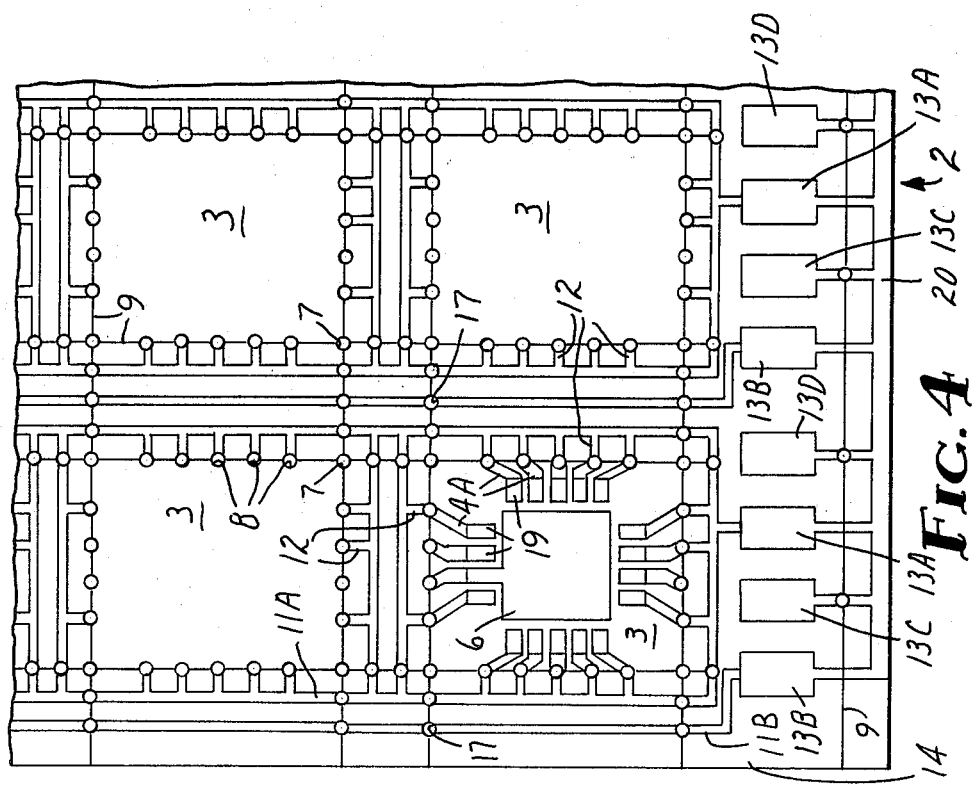
FIG. 4 represents a top plan view of another embodiment of the invention showing individual internal terminals of the substrates connected to a plurality of primary metallized traces.

In accordance with the present invention it has been discovered that increased efficiency in testing electronic components, particularly in stress and parametric testing, is achieved by constructing an array of packaging substrates so that at least some of the terminals of the substrates are electrically interconnected. This may be done, for example, by providing an array wherein all of the terminals are electrically interconnected or wherein only predetermined terminals of each substrate in the array are electrically interconnected. The former type of array may be referred to as a universal array and is shown in FIGS. 1-3, while the latter type of array may be referred to as a dedicated array and is shown in FIGS. 4 and 5.

The arrays of the invention, and the process for their construction, may be accomplished using any desired fired or unfired substrate for ceramic packages or parts. While it is preferred that the ceramic comprise alumina of purities of 90% and more, other materials possessing superior properties in one way or another may also be used. Thus, for example, beryllia may be used for superior heat conductivity; titania or titanates for high dielectric constants; and opaque ceramic where no light emission or penetration is desired. Alternatively, the arrays of the invention may be prepared from high temperature resistance polymers such as polyimide resins.

In either event, conventional metallizing materials such as tungsten, molybdenum-manganese, palladium, platinum, copper and so forth may be applied to provide the metallized pattern of the internal and external terminals, metallized traces, electrical contact pad, etc. on the arrays. This pattern may be applied by, for example, silk screening techniques. Other techniques may also be used.

After the metallized pattern has been applied to the array, desired portions of the array may be plated with, for example, gold using either electro or electroless plating techniques. Preferably the plating procedure selected provides a uniform layer of gold over all areas plated therewith.

It is contemplated that substantially any design of electronic packaging substrate can be formed in arrays according to the invention. The arrays may contain a relatively small number of substrates, e.g. ones in which no more than four substrates are present. Alternatively, they may contain a large number of substrates, e.g., ones in which there may be several hundred substrates present. Furthermore, it is comtemplated that arrays of the invention may be constructed using a single sheet on which all metallizing is deposited and then, if desired, an insulating layer of an appropriate dielectric material applied over those portions which are not to be gold plated. Still further, it is contemplated that multilayer arrays according to the invention may be constructed using two or more layers of materials, for example two or more green ceramic sheets which are adhered and fired to an integral ceramic structure. Metallized patterns may be provided on the lower layer, on several of the layers, or even on all of the layers of a multi-layer array. Suitable electrical connection is provided between the various layers by via holes or edge metallization as desired. Consequently, it is clear that the arrays of the invention may be made in many ways.

Lines along which the substrates are separable from the array are also subject to several alternative variations. For example, perforations may be provided through at least a portion of the array along the lines desired for separation. The perforations may, if desired, extend all of the way through the array. The individual packaging substrates can then be snapped apart. Another alternative is to provide scribe lines along the lines desired for separation. Scribe lines need to be provided in the array to only about one third the thickness of the array. If desired, perforations and scribe lines may be employed together. A still further alternative is to provide no perforations or scribe lines in the array, but to provide locations in the array between adjacent substrates which may be cut through by, for example, a laser beam or saw. The individual packaging substrates may then be cut away from the array.

In constructing the array of the invention, a metallized collector or band may be provided around at least a part of the periphery of the array to provide an electrical lead to all substrates if electroplating techniques are utilized. The metallized collector may be on an outer surface of the array or, where a multilayer array is utilized, it may be buried in the body of the array except for a location for connecting the electroplating lead to the array. However, if electroless plating techniques are utilized, the use of a metallized collector or band is unnecessary.

Referring to the drawings, the Figures illustrate top and bottom views of two embodiments of the invention, here comprising single layer arrays 2 of ceramic packaging substrates 3 (here chip carriers) in horizontal and vertical rows. The substrates each have a metallized pattern thereon comprising internal terminals 4 (FIGS. 1, 3 and 4), external terminals 5 (FIGS. 2 and 5), and a pad 6 for attachment of an electronic component (FIGS. 1, 3 and 4). Pad 6 is optional in the array of the invention.

The arrays 2 further have lines of separation between adjacent rows of substrates that comprise a combination of perforations 7 and 8 through the arrays 2, and scribe lines 9 on the bottom surface of the arrays of FIGS. 1-3, and the top surface of the arrays of FIGS. 4 and 5. Perforations 8 (or vias) are metallized to electrical interconnection between internal terminals 4 and external terminals 5. The embodiments illustrated in the Figures each have two parallel and spaced lines of separation between adjacent rows of substrates 3. However, it is not necessary that there be two lines of separation between all adjacent rows of substrates. It is only necessary that two lines of separation be provided between some of the adjacent rows of substrates so that there be enough space to permit the necessary electrical routing, described hereinafter.

A pair of primary metallized traces 10 (FIGS. 1 and 3) and 11 (FIGS. 4 and 5) are provided between the lines of separation. They are disposed in a spaced parallel relationship to one another, and separate sets thereof cross each other at right angles at the junctions of the horizontal and vertical rows of substrates 3. While the traces 10 and 11 are preferably provided between all of the parallel lines of separation, they may also be provided between only certain of said lines. An example of such a construction is illustrated by an array wherein some of the rows of substrates share a common line of separation while others of the rows have a pair of spaced, parallel lines between them. Additionally, only one primary metallized trace 10 of the pair of primary metallized traces need be between the spaced, parallel lines of separation.

A plurality of secondary traces 12 are provided on the arrays for electrically interconnecting internal terminals 4 to primary traces 10 and 11. Electrical contact points 13, here represented as pads, connected to traces 10 and 11 are provided in border areas 14. The electrical contact points 13 may alternatively, be located in the areas between adjacent rows of substrates 3. This permits border areas 14 to be eliminated from the arrays.

Portions of the arrays are electroplated. These portions include attachment pad 6, contact points 13, external terminals 5, and portions 19 of internal terminals 4.

Referring now specifically to FIGS. 1, 2 and 3, the universal array illustrated has all internal terminals 4, external terminals 5, traces 10, and contact points 13 electrically interconnected. Once the electronic components have been mounted in the individual packages 3 of the array 2, the desired terminals to be tested, e.g., terminals 4A and 4B, are identified in each packaging substrate and the remaining terminals 4 are disconnected from the traces 10 so that they are electrically isolated therefrom. This may be accomplished in a number of ways including, for example, laser cutting or sand blasting away a portion of secondary traces 12 and primary traces 10. These removal techniques can be programmed to travel in a desired path and provide either continuous or alternating removal along the path.

FIG. 3 is a top plan view of the universal array of FIG. 1 after terminals 4 and portions of traces 10 have been selectively removed to leave areas 16. As can be seen, only terminals 4A and 4B remain electrically interconnected to traces 10, the remaining terminals 4 having been electrically isolated from traces 10. As shown in FIG. 3, up to three passes are required from each direction in order to electrically isolate terminals 4 on each side of substrates 3. The paths of these passes are illustrated by arrows 15. The resulting array 2 then comprises rows of substrates, each substrate having terminals 4A and 4B electrically interconnected to traces 10 and contact points 13. The individual terminals 4A and 4B, however, are electrically isolated from one another so that an electrical potential difference may be applied across each of the electronic components in the row.

The number of disconnecting passes that must be made may be reduced by appropriate design of the metallized pattern of interconnections on the array. For example, the individual internal terminals 4 of adjacent substrates may be electrically interconnected by a straight metallized trace therebetween. These metallized interconnections may in turn be interconnected by either an S-shaped or diagonal trace. This type of metallized interconnection may be disconnected by a single pass of the disconnecting means.

While the array illustrated in FIG. 3 shows only one internal terminal 4A or 4B per package interconnected to a single contact point 13 by way of separate traces 10, it is contemplated that more than one terminal 4A or 4B may be interconnected to each of the contact points 13.

The array illustrated in FIG. 3 enables one to apply a single potential difference to all of the packaging substrates in a given row for burn-in testing. Furthermore, as the array permits a selected number of the terminals 4 to be electrically isolated from each other and from traces 10, it is also possible to probe and completely electrically test each of the electronic components in the array.

FIGS. 4 and 5 show a dedicated array having its internal terminals 4 and external terminals 5 electrically interconnected. The Figures further show a plurality of primary metallized traces 11 that are electrically isolated from one another but that are electrically interconnected to designated internal terminals 4 or external terminals 5. Each of the primary metallized traces 11 is electrically interconnected to an individual contact point 13. The metallized traces 11 are electrically isolated from one another so that the same terminals on each of the substrates throughout the array can be burn-in tested without having to disconnect the other terminals from the primary traces.

In the array shown in FIG. 4, each vertical row of substrates contains two separate primary traces on its top surface. Trace 11A is electrically interconnected through secondary traces 12 to internal terminals 4A and contact point 13A, while trace 11B is electrically interconnected to external terminals 5B on the bottom of the array (see FIG. 5) and contact point 13B. Interconnection of trace 11B on the top and bottom surfaces of the array is made through metallized vias 17. As can be seen, trace 11B is appropriately routed so that it does not contact any other traces.

FIG. 4 further shows electrical contact points 13C and 13D located on the top surface of the array. These contact points are respectively electrically interconnected to traces 11C and 11D through metallized vias 18 to corresponding metallized traces 11C and 11D on the bottom of the array (see FIG. 5). Traces 11C and 11D are in turn respectively electrically interconnected to external terminals 5C and 5D. While the array shown in FIG. 4 shows only one internal or external terminal interconnected to primary traces 11B, C, or D, it is contemplated that more than one of said terminals may be interconnected thereto if desired. Furthermore, while FIGS. 4 and 5 show the use of four primary metallized traces, the exact number of primary traces is not critical to the invention, provided that at least two primary metallized traces be employed.

The contact points 13A, B, C and D may be provided for each vertical row of substrates as shown in FIG. 4. Alternatively, one set of contact points 13A, B, C, or D may be provided for all vertical rows of substrates.

FIG. 4 further shows scribe line 9, metallized performations 8, and metallized vias 17 and 18 which together comprise the lines of separation. Additionally, FIG. 4 shows a metallized collector 20 which is electrically isolated or removed before testing.

The dedicated array enables one to burn-in test electronic components in a given row of substrates by the simple application of a potential difference across the row. This may be done by applying different electrical potentials to at least two of contact points 13A, B, C, or D. The dedicated array may also be utilized for parametric testing of the electronic components. This may be accomplished by electrically isolating terminals 4A.

What is claimed:

1. An array of electronic packaging substrates comprising:

a multiplicity of electronic packaging substrates in horizontal and vertical rows located in a plane, each substrate having a plurality of internal and external terminals which are electrically interconnected, said array having lines of separation along which each substrate is separable from said array, a plurality of adjacent rows of substrates having lines of separation therebetween that are spaced and parallel, at least a pair of primary metallized traces for providing electrical interconnection to said substrates, wherein at least one of said pair is between at least some of said spaced parallel lines of separation between adjacent rows of substrates, and wherein the first of said pair is electrically interconnected by secondary metallized traces to at least the same internal terminal of each said substrate in said rows adjacent said primary metallized traces, and wherein the second of said pair is electrically interconnected by secondary metallized traces to at least the same other internal terminal of each said substrate in said rows adjacent said primary metallized traces, and wherein said internal terminal connected to said first of said pair is electrically isolated from said internal terminal connected to said second of said pair, and an electrical contact point on said array electrically connected to each said primary metallized trace.

2. An array according to claim 1 having said spaced, parallel lines of separation between all adjacent rows of substrates.

3. An array according to claim 1 or 2 wherein said pair of primary metallized traces is disposed between said spaced, parallel lines of separation.

4. An array according to claim 1 wherein at least one of said primary metallized traces is disposed on each opposed major surface thereof.

5. An array according to claim 1 having a border at least partially therearound with at least one of said electrical contact points disposed on said border.

6. A method for testing a multiplicity of electronic components, said method comprising the steps of:

A. providing an array of electronic packaging substrates, said array comprising a multiplicity of electronic packaging substrates in horizontal and vertical rows located in a plane each substrate having a plurality of internal and external terminals which are electrically interconnected; said array having (1) lines of separation along which each substrate is separable from said array, (2) a plurality of adjacent rows of substrates having lines of separation therebetween that are spaced and parallel, (3) at least a pair of primary metallized traces for providing electrical interconnection to said substrates, at least one of said primary metallized traces being between at least some of said spaced parallel lines of separation between adjacent rows of substrates, (4) an electrical contact point on said array electrically connected to each said primary metallized trace, and (5) a plurality of secondary metallized traces electrically connecting at least one of said internal terminals of each of said substrates in said adjacent rows to said primary metallized traces;

B. mounting electronic components on a predetermined number of said substrates;

C. electrically connecting said electronic components to said internal terminals of said substrates; and D. selectively applying predetermined electrical potentials to only certain of said internal terminals of each said substrates throughout said array at a predetermined temperature and for a predetermined time.

7. A method according to claim 6 wherein, prior to applying said potential, said secondary metallized traces electrically connecting said internal terminals of each said substrates in said adjacent rows to said primary metallized traces are selectively removed.

8. A method according to claim 6 comprising the further steps of constructing a plurality of said arrays and simultaneously applying said electrical potential in parallel to said plurality of arrays.

9. A method according to claim 6 wherein the first of said pair of primary metallized traces is electrically interconnected to at least the same internal terminal of each said substrate in said rows adjacent said primary metallized traces and wherein the second of said pair is electrically interconnected to at least the same other internal terminal of each said substrate in said rows adjacent said primary metallized traces, and wherein said internal terminal connected to said first of said pair is electrically isolated from said internal terminal connected to said second of said pair.

* * * * *